(12) United States Patent
Ohtsubo

(10) Patent No.: US 10,304,619 B2
(45) Date of Patent: May 28, 2019

(54) ELECTRONIC COMPONENT AND ELECTRONIC EQUIPMENT USING SAME

(71) Applicant: Panasonic Intellectual Property Management Co., Ltd., Osaka (JP)

(72) Inventor: Mutsuyasu Ohtsubo, Hyogo (JP)

(73) Assignee: PANASONIC INTELLECTUAL PROPERTY MANAGEMENT CO., LTD., Osaka (JP)

( * ) Notice: Subject to any disclaimer, the term of this patent is extended or adjusted under 35 U.S.C. 154(b) by 0 days.

(21) Appl. No.: 15/550,963

(22) PCT Filed: Feb. 22, 2016

(86) PCT No.: PCT/JP2016/000919
§ 371 (c)(1),
(2) Date: Aug. 14, 2017

(87) PCT Pub. No.: WO2016/166925
PCT Pub. Date: Oct. 20, 2016

(65) Prior Publication Data
US 2018/0033543 A1    Feb. 1, 2018

(30) Foreign Application Priority Data

Apr. 16, 2015  (JP) ................................ 2015-084049
Jan. 18, 2016  (JP) ................................ 2016-006730

(51) Int. Cl.
*H01F 17/04*    (2006.01)
*H01F 27/24*    (2006.01)
(Continued)

(52) U.S. Cl.
CPC .......... *H01F 27/292* (2013.01); *H01F 17/04* (2013.01); *H01F 27/24* (2013.01); *H01F 27/28* (2013.01);
(Continued)

(58) Field of Classification Search
CPC .......... H01F 17/04; H01F 27/24; H01F 27/28; H01F 27/29; H01F 27/292;
(Continued)

(56) References Cited

U.S. PATENT DOCUMENTS

2009/0128275 A1   5/2009  Yagasaki et al.
2012/0146758 A1*  6/2012  Goto ...................... H01F 27/06
                                                  336/212
2014/0210586 A1*  7/2014  Atsumi ................. H01F 27/292
                                                  336/192

FOREIGN PATENT DOCUMENTS

JP    5-033506 U    4/1993
JP    5-033571 U    4/1993
(Continued)

OTHER PUBLICATIONS

International Search Report of PCT application No. PCT/JP2016/000919 dated Mar. 29, 2016.

*Primary Examiner* — Timothy J Thompson
*Assistant Examiner* — Guillermo J Egoavil
(74) *Attorney, Agent, or Firm* — McDermott Will & Emery LLP

(57) ABSTRACT

An electronic component includes a circuit element, a body accommodating the circuit element therein, and a holder made of a metal plate and holding the circuit element. The circuit element includes an end portion extending out of the body from a side surface of the body. The end portion extends from the side surface of the body toward a bottom surface of the body. The holder has first and second side surface portions and a bottom surface portion facing the bottom surface of the body. The first and second side surface portions face the side surface of the body. The first and second side surface portions are disposed with respective gaps from the end portion of the circuit element such that the end portion of the circuit element is positioned between the (Continued)

first and second side surface portions. The bottom surface portion is connected to the first and second side surface portions. The end portion of the circuit element is fixed to the bottom surface portion. Widths of the first and second side surface portions are larger than a width of the end portion of the circuit element. This electronic component prevents terminals from being broken due to vibrations even if electronic component has a small size, thus having a high reliability as an automobile component.

26 Claims, 10 Drawing Sheets

(51) Int. Cl.
    *H01F 27/28*     (2006.01)
    *H01F 27/29*     (2006.01)
    *H05K 1/11*     (2006.01)
    *H05K 1/18*     (2006.01)
    *H05K 3/34*     (2006.01)

(52) U.S. Cl.
    CPC .......... *H01F 27/2828* (2013.01); *H05K 1/11* (2013.01); *H05K 1/181* (2013.01); *H01F 2017/048* (2013.01); *H05K 3/3442* (2013.01); *H05K 2201/1003* (2013.01); *H05K 2201/10636* (2013.01); *Y02P 70/611* (2015.11)

(58) Field of Classification Search
    CPC . H01F 27/2828; H01F 2017/048; H05K 1/11; H05K 1/18; H05K 1/181; H05K 3/3442; H05K 2201/1003; H05K 2201/10636
    USPC .......................................... 361/321; 336/83
    See application file for complete search history.

(56) References Cited

FOREIGN PATENT DOCUMENTS

| | | | | |
|---|---|---|---|---|
| JP | 2006-278612 | | 10/2006 | |
| JP | 2006278612 | A * | 10/2006 | |
| JP | 2006278612 | A * | 10/2006 | ............. H01F 17/04 |
| JP | 2009-123927 | | 6/2009 | |
| JP | 2012195399 | A * | 10/2012 | ............. H01F 27/29 |
| JP | 2013045871 | A * | 3/2013 | |
| JP | 2013045871 | A * | 3/2013 | ............. H01F 27/28 |
| JP | 2013-191726 | | 9/2013 | |

* cited by examiner

ELECTRONIC COMPONENT AND ELECTRONIC EQUIPMENT USING SAME

CROSS-REFERENCE TO RELATED APPLICATIONS

This application is a U.S. national stage application of the PCT international application No.PCT/JP2016/000919 filed on Feb. 22, 2016, which claims the benefit of foreign priority of Japanese patent application No. 2015-084049 filed on Apr. 16, 2015 and Japanese patent application No. 2016-006730 filed on Jan. 18, 2016, the contents all of which are incorporated herein by reference.

TECHNICAL FIELD

The present invention relates to an electronic component used for various electronic devices and to an electronic device using the component.

BACKGROUND ART

Automobiles using electronically controlled systems for driving systems and control systems have been increasing, and accordingly increasing the number of electronic control devices equipped in each automobile. Under these circumstances, more downsizing and higher reliability of the electronic control devices are desired.

Electronic components used for these electronic control devices are desired to be surface-mountable for small-sizing and to have such a high reliability that is required for automobile parts.

FIG. 12 is a plan view of conventional electronic component 501 disclosed in PTL 1. FIG. 13 is a sectional view of electronic component 501 along line 13-13 shown in FIG. 12.

As shown in FIG. 12 and FIG. 13, body 2 of electronic component 501 is formed by embedding circuit element 1, a coil, in a mixed powder of magnetic metal powder with binder composed of thermosetting resin, and molding the mixed powder by compression molding. Respective ends of lead wires 3 of circuit element 1 projected from a side surface of body 2 is pressed to have a flat shape, and bent from the side surface to the bottom surface of body 2 to form surface mount type terminals 4. Circuit element 1, a coil, is formed by winding a copper wire coated with an insulating film.

Electronic component 501 is mounted on lands 6 of mounting substrate 5 with solder 7 in a reflow solder bath.

CITATION LIST

Patent Literature

PTL 1: Japanese Patent Laid-Open Publication No. 2009-123927

SUMMARY

An electronic component includes a circuit element, a body accommodating the circuit element therein, and a holder made of a metal plate and holding the circuit element. The circuit element includes an end portion extending out of the body from a side surface of the body. The end portion extends from the side surface of the body toward a bottom surface of the body. The holder has first and second side surface portions and a bottom surface portion facing the bottom surface of the body. The first and second side surface portions face the side surface of the body. The first and second side surface portions are disposed with respective gaps from the end portion of the circuit element such that the end portion of the circuit element is positioned between the first and second side surface portions. The bottom surface portion is connected to the first and second side surface portions. The end portion of the circuit element is fixed to the bottom surface portion. Widths of the first and second side surface portions are larger than a width of the end portion of the circuit element.

This electronic component prevents terminals from being broken due to vibrations even if electronic component has a small size, thus having a high reliability as an automobile component.

DETAIL DESCRIPTION OF PREFERRED EMBODIMENT

Figure 1A:
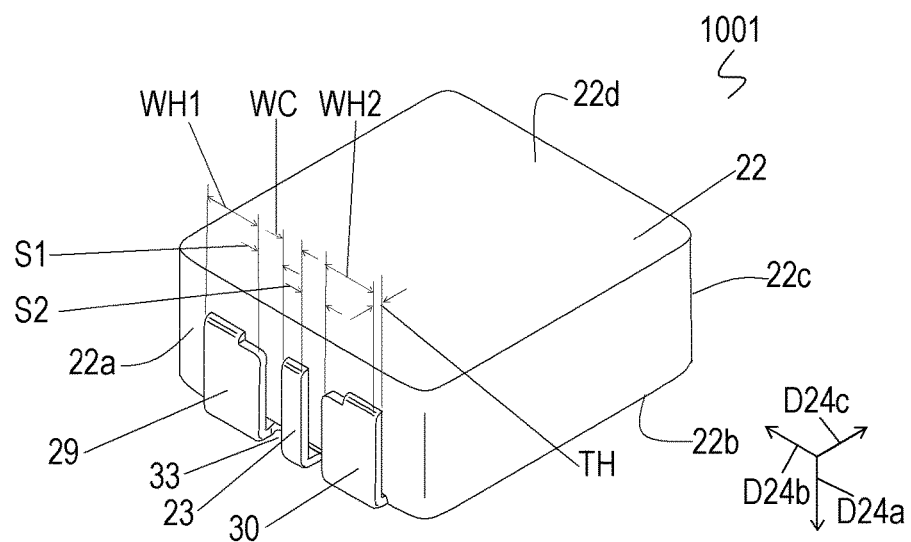
FIG. 1A is a perspective view of an electronic component in accordance with an exemplary embodiment.

FIG. 1A is a perspective view of electronic component 1001 in accordance with an exemplary embodiment. FIG.

Figure 2:
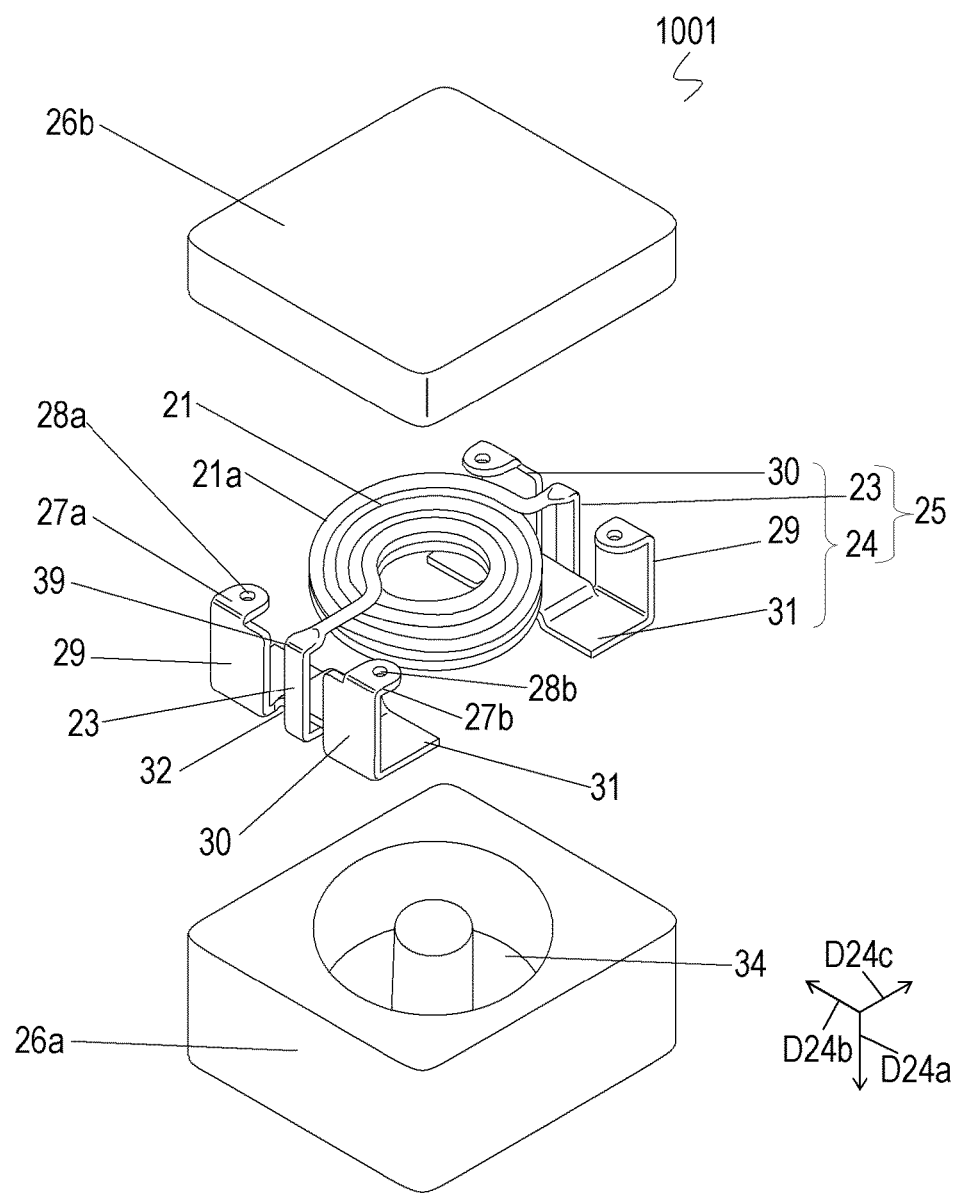
FIG. 2 is an exploded perspective view of the electronic component in accordance with the embodiment.

1B is a perspective view of electronic component 1001. FIG. 2 is an exploded perspective view of electronic component 1001.

Electronic component 1001 includes circuit element 21, body 22 accommodating circuit element 21 therein, and two holders 24 fixed on side surfaces of body 22. Body 22 has substantially a rectangular columnar shape having side surfaces 22a and 22c opposite to each other and bottom surface 22b connected to side surfaces 22a and 22c. In electronic component 1001 in accordance with the embodiment, bottom surface 22b is connected perpendicularly to side surfaces 22a and 22b. Circuit element 21 has two end portions 23 projecting from respective ones of side surfaces 22a and 22c of body 22 to be led out of body 22. Two holders 24, made of metal plates are fixed to respective ones of side surfaces 22a and 22c of body 22 so as to cause fix two end portions 23 of circuit element 21 while overlap two end portions 23 to hold the positions and shapes of end portions 23 of circuit element 21. Two end portions 23 of circuit element 21 and two holders 24 constitute two terminal portions 25, respectively. One of terminal portions 25 bends along side surface 22a and bottom surface 22b of body 22 and extends from side surface 22a to bottom surface 22b of body 22. The other of terminal portions 25 bends along side surface 22c and bottom surface 22b of body 22 and extends from side surface 22c to bottom surface 22b of body 22, thereby providing surface mount type electronic component 1001. An outline of body 2 is indicated by broken lines in FIG. 1B.

Circuit element 21 has functional portion 21a and end portions 23 extending from functional portion 21a. Functional portion 21a functions as an air-core coil including an insulation-coated metal wire wound spirally. The insulation-coated metal wire includes a welding layer In accordance with the embodiment, the metal wire is a copper wire having a circular cross section having a diameter of 0.30 mm. The metal wire is wound by eleven turns with a diameter of 2.2 mm. End portions 23 of circuit element 21 extend from functional portion 21a in directions opposite to each other. The shape of circuit element 21 is maintained by curing the welding layer.

Body 22 functions also as a magnetic core of circuit element 21. Body 22 includes green blocks 26a and 26b. Each of green blocks 26a and 26b contains a binder and magnetic metal powder mixed with the binder. The binder contains a thermosetting resin. Green blocks 26a and 26b can be obtained by obtaining a mixture of the binder mixed with the magnetic metal powder while the thermosetting resin is not completely cured and by molding the mixture by a compression molding under a pressure of about 1 ton/cm$^2$. Green blocks 26a and 26b are placed so as to sandwich circuit element 21 between the blocks, and are processed by a re-compression molding and a heat treatment such that circuit element 21 is coated with green blocks 26a and 26b and that the thermosetting resin is completely cured, thereby providing body 22.

In the re-compression molding, green blocks 26a and 26b are pressed under a pressure of about 5 tons/cm$^2$, which is larger than the pressure of the first compression molding, so that the thicknesses of green blocks 26a and 26b becomes smaller after the re-compression molding and the densities of the green blocks becomes smaller than before the re-compression molding.

In accordance with the present embodiment, as shown in FIG. 2, body 22 is constituted by two green blocks 26a and 26b. One green block 26a has a quadrangular column shape including accommodating portion 34 which is a recess configured to accommodate circuit element 21 therein. The other green block 26b has a lid shape covering green block 26a. Two end portions 23 of circuit element 21 and two holders 24 project from a boundary plane between two green blocks 26a and 26b in directions opposite to each other from opposite side surfaces 22a and 22c of body 22.

Holder 24 is formed by punching a metal plate having a thickness of about 0.15 mm. Holder 24 may be made of a material that can retain a shape by itself and having a higher strength than end portions 23 of circuit element 21. For example, phosphor bronze may be preferable as the material of holders 24.

Holder 24 extends from side surface 22a (22c) in extending direction D24a toward bottom surface 22b along side surface 22a (22c). In accordance with the present embodiment, extending direction D24a is perpendicular to bottom surface 22b. Holder 24 includes projections 27a and 27b provided at an end of holder 24 in extending direction D24a. Projections 27a and 27b are embedded in body 22 to be fixed to body 24 such that end portion 23 of circuit element 21 is positioned substantially at a center of body 22 in extending direction D24a. Through-holes 28a and 28b may be preferably formed in projections 27a and 27b, respectively, to increase the fixing strength of holder 24.

End portion 23 of circuit element 21 is electrically connected and mechanically fixed to the other end of holder 24 in extending direction D24a by resistance welding. Holder 24 is bent together with end portion 23 of circuit element 21 from side surface 22a (22c) of body 22 toward bottom surface 22b of body 22, providing surface mount type terminal portion 25 having end portion 23 of the circuit element disposed on a mounting surface.

The shape of holder 24 will be detailed below. Holder 24 has side surface portions 29 and 30 facing side surface 22a of body 22, bottom surface portion 31 connected to side surface portions 29 and 30, and projections 27a and 27b. Bottom surface portion 31 faces bottom surface 22b of body 22. Side surface portions 29 and 30, bottom surface portion 31, and projections 27a and 27b are formed unitarily. Side surface portions 29 and 30 are disposed on both sides of end portion 23 in direction D24b of circuit element 21 and located away from end portion 23 with respective gaps S1 and S2 from end portion 23. End portion 23 of circuit element 21 is fixed to bottom portion 31. Bottom surface portion 31 does not extend to side surfaces 22a and 22c of body 22, so that side surface portions 29 and 30 are apart from each other on side surface 22a (22c) and are apart from end portion 23 of circuit element 21.

Side surface portions 29 and 30 extend along side surface 22a (22c) of body 22 while extending with end portion 23 of circuit element 21. Direction D24b perpendicular to extending direction D24a and parallel to side surface 22a (22c) is defined. Respective widths WH1 and WH2 of side surface portions 29 and 30 in direction D24b is larger than width WC of end portion 23 of circuit element 21 in direction D24b.

Bottom surface portion 31 has a stepped portion 32 locally recessed toward bottom surface 22b of body 22. End portion 23 of circuit element 21 overlaps stepped portion 32 of bottom surface portion 31 and is fixed on stepped portion 32. In accordance with the present embodiment, the depth of stepped portion 32 is 0.18 mm. Housing recess 33 for accommodating bottom surface portion 31 and stepped portion 32 therein is provided in bottom surface 22b of body 22. This configuration prevents an increase of the height of electronic component 1001.

In that case where the diameter of end portion 23 of circuit element 21 is too large to be placed within stepped portion 32, end portion 23 of circuit element 21 may be previously processed to have a flat shape. In accordance with the present embodiment, end portion 23 is pressed to become a flat plate having a thickness of 0.18 mm.

Electronic component 1001 in accordance with the present embodiment is an electronic component with a small size having outer dimensions of 6.5 mm×6.0 mm×2.6 mm, and a height of 1.8 mm to the mounting surface from the portion at which end portion 23 of circuit element 21 projects from side surface 22a (22c) of body 22.

Electronic component 1001 in accordance with the present embodiment is configured to be mounted onto a mounting substrate by reflow soldering to be used for various electronic devices.

Figure 3A:
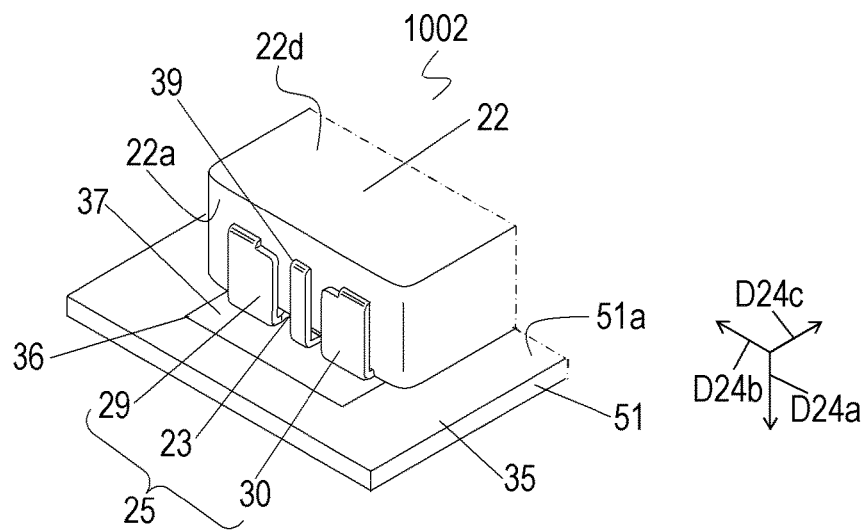
FIG. 3A is a partial perspective view of the electronic device in accordance with the embodiment.
Figure 3B:
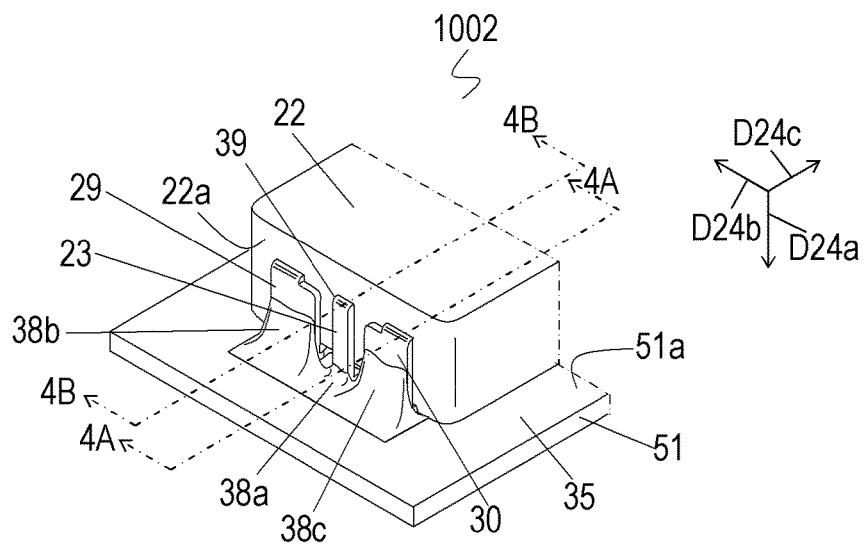
FIG. 3B is a partial perspective view of the electronic device in accordance with the embodiment.
Figure 4A:
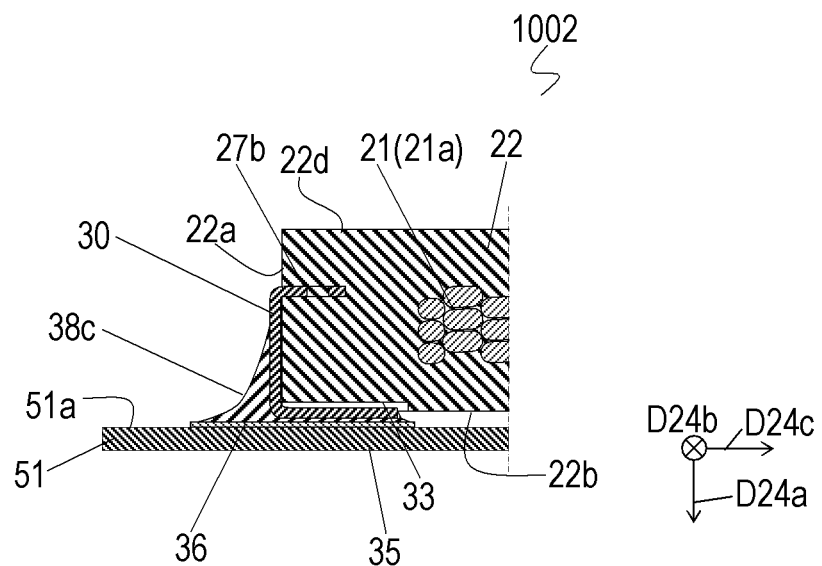
FIG. 4A is a sectional view of the electronic device along line 4A-4A shown in FIG. 3B.
Figure 4B:
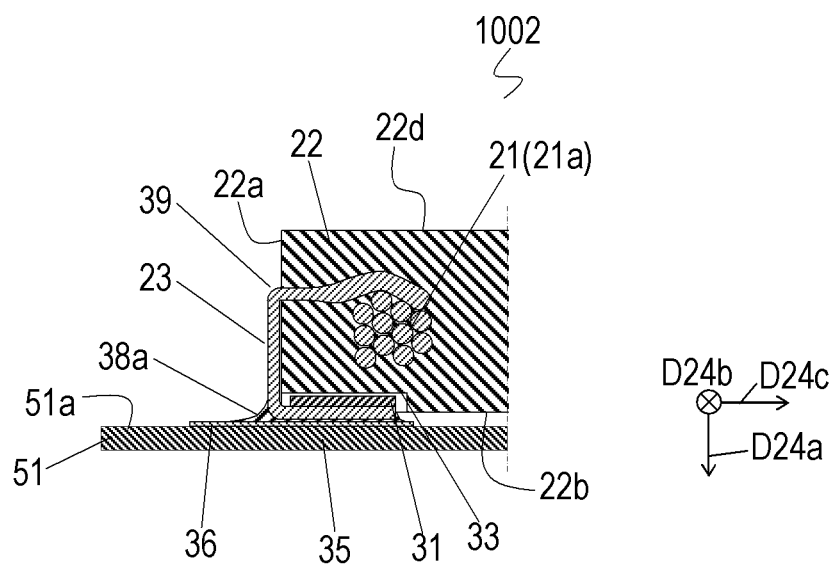
FIG. 4B is a sectional view of the electronic device along line 4B-4B shown in FIG. 3B.

FIG. 3A is a partial perspective view of electronic device 1002 showing a state before reflow soldering in which electronic component 1001 is placed on mounting substrate 35 of electronic device 1002. FIG. 3B is a partial perspective view of electronic device 1002 showing electronic component 1001 mounted on mounting substrate 35 of electronic device 1002 after reflow soldering. FIG. 4A is a sectional view of electronic device 1002 along line 4A-4A shown in FIG. 3B. FIG. 4B is a sectional view of electronic device 1002 along line 4B-4B shown in FIG. 3B.

Mounting substrate 35 includes insulating substrate 51 and conductive lands 36 provided on surface 51a of insulating substrate 51.

Terminal portion 25 of electronic component 1001 is placed on mounting substrate 35 having land 36 coated with solder 37, as shown in FIG. 3A, and soldered by reflow soldering, thereby providing solder fillets 38a to 38c, as shown in FIG. 3B. Solder fillet 38a extends on end portion 23 of circuit element 21 and land 36. Solder fillet 38b extends on side surface portion 29 and land 36. Solder fillet 38c extends on side surface portion 30 and land 36. In electronic component 1001 in accordance with the present embodiment, side surface portions 29 and 30 facing side surface 22a (22c) of body 22 are disposed such that end portion 23 of circuit element 21 is positioned between side surface portions 29 and 30 with respective gaps S1 and S2 from end portion 23. This structure allows molten solder 37 to easily separate to side surface portion 29, end portion 23 of circuit element 21, and side surface portion 30, thereby forming solder fillets 38b, 38a and 38c on side surface portion 29, end portion 23 of circuit element 21 and side surface portion 30, respectively. This configuration provides electronic component 1001 with smaller heights of solder fillets 38a to 38c than an electronic component including integral terminals without any gaps between end portion 23 of circuit element 21 and side surface portions 29 and 30.

A dimension of each of gaps S1 and S2 in direction D24b is preferably twice to 10 times thickness TH of holder 24 in direction D24c perpendicular to directions D24a and D24b. Gaps S1 and S2 smaller than twice thickness TH of holder 24 are not preferable since solder flowing around in thickness direction D24c of holder 24 may easily form a bridge between holder 24 and end portion 23 of circuit element 21, so that solder fillets 38a to 38c may be formed to be an integral solder fillet. Gaps S1 and S2 larger than 10 times thickness TH of holder 24 are not preferable since the small dimensions of side surface portions 29 and 30 may not effectively exhibit. Each of gaps S1 and S2 may more preferably have a dimension ranging from three times to six times thickness TH of holder 24. In accordance with the present embodiment, each of gaps S1 and S2 a dimension four times thickness TH of holder 24.

Respective widths WH1 and WH2 of side surface portion 29 and side surface portion 30 in direction D24b are larger than width WC of end portion 23 of circuit element 21 in direction D24b. This configuration causes large amounts of molten solders 37 to be attracted to side surface portions 29 and 30 than to end portion 23 of circuit element 21. Accordingly, the amount of solder 37 around end portion 23 of circuit element 21 decreases, so that the height of solder fillet 38a formed on end portion 23 of circuit element 21 can be lower than the heights of solder fillets 38b and 38c formed on side surface portions 29 and 30.

Each of widths WH1 and WH2 of side surface portions 29 and 30 may be preferably twice to ten times width WC of end portion 23 of circuit element 21. Widths WH1 and WH2 of side surface portions 29 and 30 smaller than twice the width WC of end portion 23 are not preferable since the amount of solder 37 around end portion 23 of circuit element 21 can hardly decrease. Widths WH1 and WH2 of side surface portions 29 and 30 larger than ten times the width WC of end portion 23 are not preferable since the outer dimensions of electronic component 1001 increase. Each of widths of WH1 and WH2 of side surface portions 29 and 30 may be more preferably three times to six times the width WC of end portion 23 of circuit element 21. In accordance with the present embodiment, each of widths WH1 and WH2 of side surface portions 29 and 30 is 3.5 times the width WC of end portion 23.

In recent years, mounting positions of electronic control devices for automobiles have also been changing. That is, the number of automobile electronic control devices that are mounted in the engine room has been increasing instead of being mounted outside the engine room in the conventional manner. Accordingly, it has been desired to improve the vibration resistance of the automobile electronic control devices.

Under such circumstances, requirement for small-sizing of electronic components has also been becoming stronger. Requirement for small-sizing the heights of electronic components to be equivalent to 3 mm, and further to 2 mm, has been becoming stronger, compared to the conventional sizes of 4 mm to 5 mm.

Figure 12:
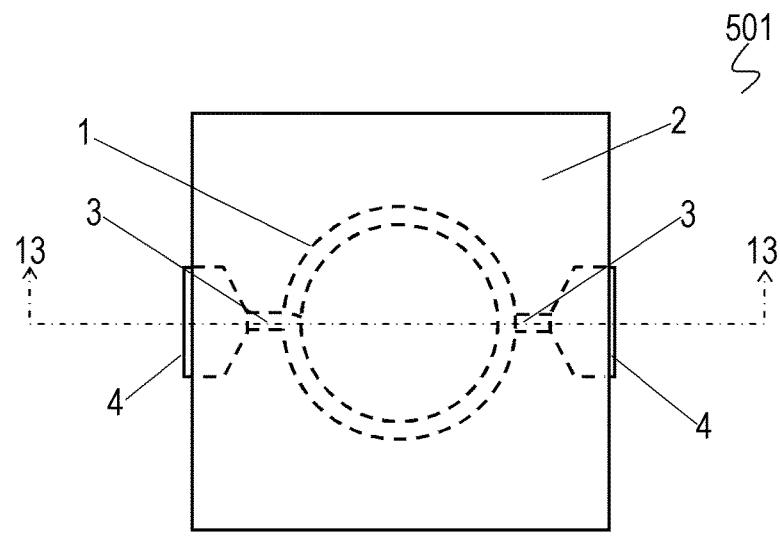
FIG. 12 is a plan view of a conventional electronic component.
Figure 13:
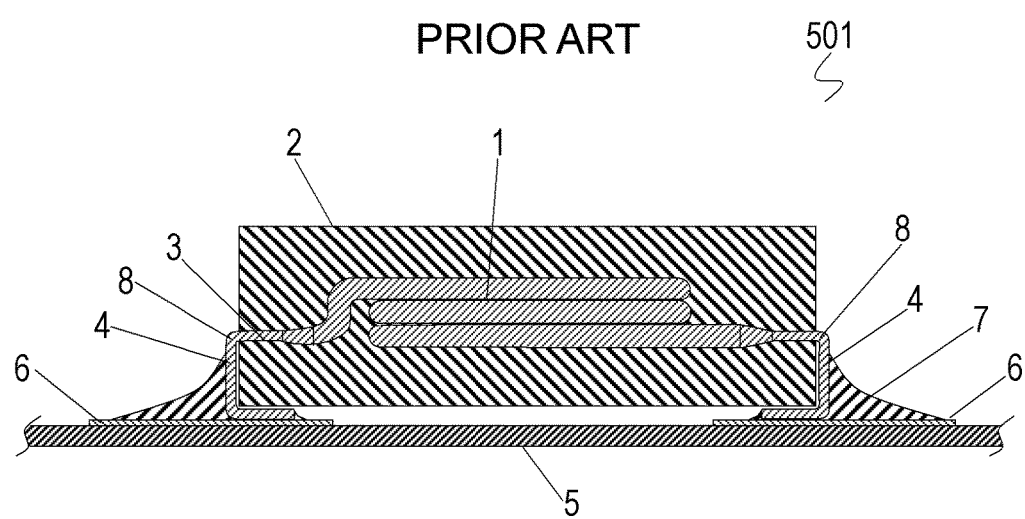
FIG. 13 is a sectional view of the electronic component along line 13-13 shown in FIG. 12.

In the conventional electronic component 501 as shown in FIG. 12 and FIG. 13 disclosed in PTL 1, if the height of electronic component 501 decreases to 3 mm or smaller, the height of terminal 4 bent from the side surface to the bottom surface of body 2 ranges from about 1 mm to 2 mm. Accordingly, the fillet of solder 7 which is formed when electronic component 501 is mounted on mounting substrate 5 extends close to bent portion 8. The fillet of solder 7 extends close to bent portion 8 causes terminal 4 to be hardened by the solder, so that terminal 4 itself cannot bend. As a result, the stress by automobile vibration transmitted through mounting substrate 5 transmits and concentrate to bent portion 8 of terminal 4 without being reduced. This causes a risk that bent portion 8 of terminal 4 may cause a metal fatigue and brake, hence disconnecting electronic component 501.

In the case that electronic device 1002 on which electronic component 1001 is mounted is equipped in an automobile, vibration of the automobile transmits through mounting substrate 35 to electronic component 1001. Since a part of end portion 23 of circuit element 21 on which solder fillet 38a is not formed can be large in electronic component 1001 as described above, the part of end portion 23 of circuit element 21 on which solder fillet 38a is not formed can bend to weaken the stress of the automobile vibration transmitted through mounting substrate 35. Therefore, this configuration prevents concentration of the vibration stress on and breaking of side surface bent portion 39 which is a part of end portion 23 of circuit element 21 extending out of body 22 from side surface 22a (22c) of body 22 and bent in parallel to side surface 22a (22c).

The electronic component can be securely fixed to the mounting substrate with large solder fillets 38b and 38c formed on side surface portions 29 and 30. This configuration prevents end portion 23 of circuit element 21 from being broken by the vibration even if the electronic component has a small sized, hence enhancing a reliability of electronic component 1001.

Figure 1B:
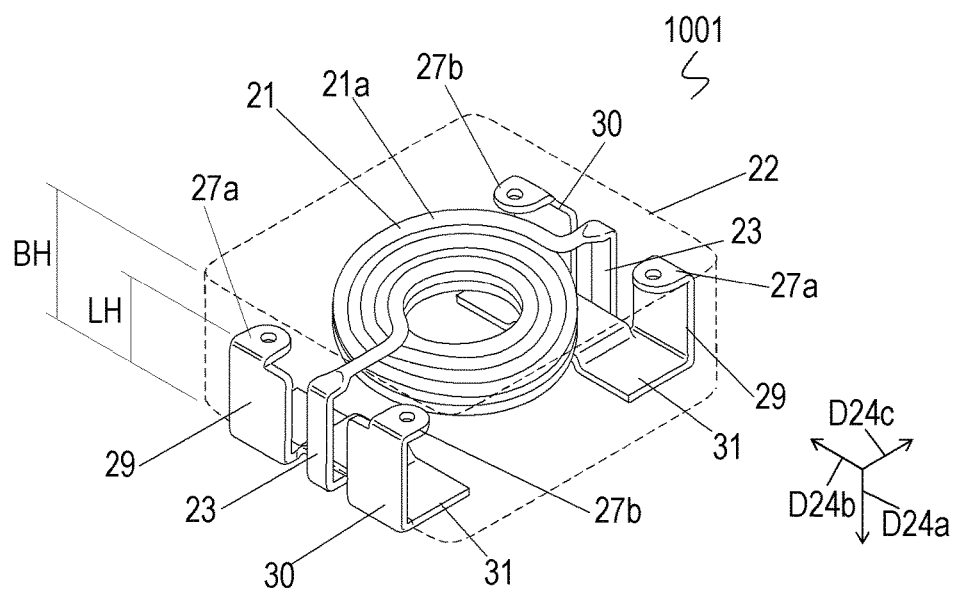
FIG. 1B is a perspective view of the electronic component in accordance with the embodiment.
Figure 5:
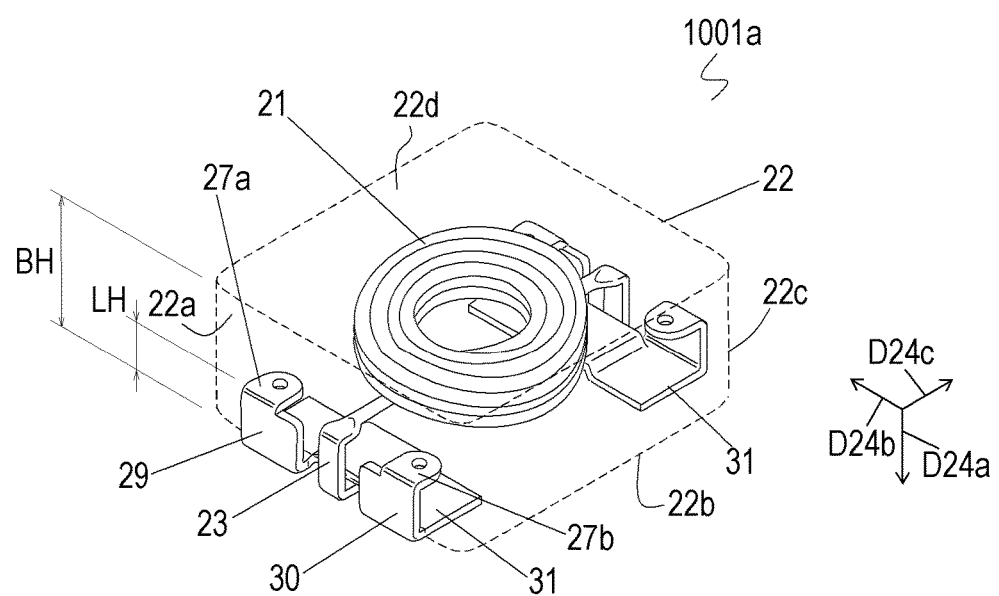
FIG. 5 is a perspective view of another electronic component in accordance with the embodiment.

FIG. 5 is a perspective view of another electronic component 1001a in accordance with the embodiment. In FIG. 5, components identical to those of electronic components 1001 shown in FIG. 1B are denoted by the same reference numerals. In electronic component 1001a shown in FIG. 1B, height LH of the position at which end portion 23 of circuit element 21 extends out of body 22 from side surface 22a (22c) of body 22 from bottom surface 22b of body 22 in extending direction D24a is larger than a half the height BH of body 22 in extending direction D24a. In other words, end portion 23 of circuit element 21 extends out of body 22 from a position on side surface 22a (22c) in extending direction D24a between upper surface 22d of body 22 and a center of height BH of body 22 in extending direction D24a. In electronic component 1001a shown in FIG. 5, height LH of the position at which end portion 23 of circuit element 21 extends out of side surface 22a (22c) of body 22 from bottom surface 22b of body 22 in extending direction D24a is smaller than a half the height BH of body 22 in extending direction D24a. In other words, end portion 23 of circuit element 21 extends out of body 22 at a position on side surface 22a (22c) in extending direction 24a between bottom surface 22b of body 22 and a center of height BH of body 22 in extending direction D24a.

FIG. 5 is a transparent perspective view in which body 22 is drawn as transparent similarly to FIG. 1B. In electronic component 1001 shown in FIG. 1B, end portion 23 extends from the upper end of circuit element 21, and out of body 22 from side surface 22a (22c) of body 22.

On the other hand, in electronic component 1001a shown in FIG. 5, end portion 23 is extended from the lower end of circuit element 21. End portion 23 extends out of body 22 from a position between the center of height BH of body 22 and bottom surface 22b of body 22.

This configuration reduces the dimensions of side surface portions 29 and 30 in extending direction D24a and the dimension of end portion 23 of the circuit element from the portion at which end portion 23 of the circuit element extends out of body 22 to bottom surface 22b. Then, side surface portions 29 and 30 are fixed with solders covering the area extending close to the extending portion, and decreases the dimension of end portion 23 of circuit element 21. This configuration reduces the amount of deflection of end portion 23 caused by an automobile vibration, thereby decreasing the stress applied to side surface bent portion 39.

The dimension of gaps S1 and S2 may not necessarily be identical to each other while widths WH1 and WH2 of side surface portions 29 and 30 may not necessarily be identical to each other. In accordance with the present embodiment, the dimension of gaps S1 and S2 are identical to each other while widths WH1 and WH2 of side surface portions 29 and 30 are identical to each other, thereby forming solder fillets 38a to 38c in a preferable balance, and allowing solder fillets 38b and 38c to have the same shapes and sizes.

A method of manufacturing electronic component 1001 in accordance with the embodiment will be described below with reference to the drawings. FIGS. 6 to 9 are perspective views of electronic component 1001 for illustrating processes for manufacturing electronic component 1001.

Figure 6:
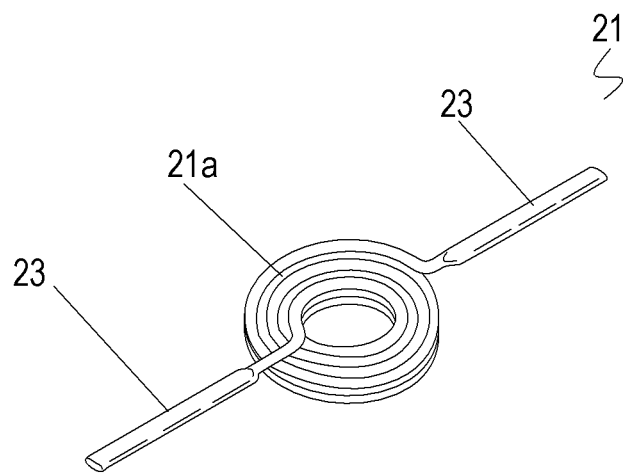
FIG. 6 is a perspective view illustrating of the electronic component in accordance with the embodiment for illustrating a process for manufacturing the electronic component.

First, as shown in FIG. 6, an insulation-coated copper wire with a welding layer is spirally wound to form circuit element 21, an air core coil.

The insulation-coated metal wire with a welding layer is wound on a specified winding shaft. Then, end portions 23 at both ends of circuit element 21 are led in directions opposite to each other. Then, hot air is blown against the wound part or a solvent is dropped on the wound part to cause a curing reaction of the welding layer, so that the wound part of coil, or functioning portion 21a, retains its shape. The shape-retained functioning portion 21a is removed from the winding shaft to obtain circuit element 21 having functioning portion 21a, which is an air core coil, and end portions 23 which extend from functioning portion 21a in direction opposite to each other.

Figure 7:
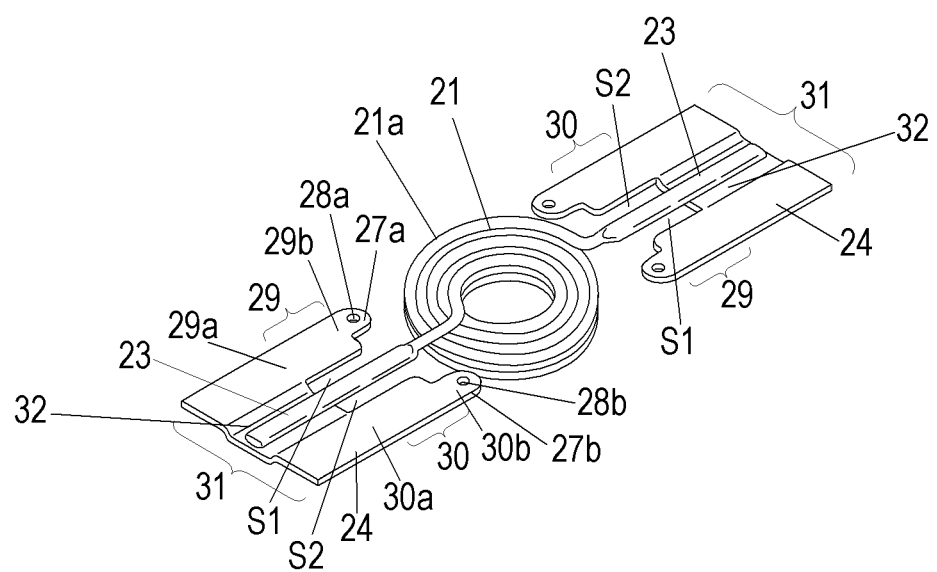
FIG. 7 is a perspective view of the electronic component in accordance with the embodiment for illustrating a process for manufacturing the electronic component.

Next, as shown in FIG. 7, end portions 23 of circuit element 21 are welded to holders 24 by a resistance welding to be electrically connected to and mechanically fixed to holders 24.

Each holder 24 has bottom surface portion 31 and side surface portions 29 and 30 which are connected to bottom surface portion 31 and extend in parallel to each other, thus having substantially a U-shape. Specifically, side surface portion 29 has end 29a connected to bottom surface portion 31 and end 29b opposite to end 29a. Side surface portion 30 has end 30a connected to bottom surface portion 31 and end 30b opposite to end 30a. Holder 24 is formed by pressing a metal plate. In accordance with the present embodiment, holder 24 is formed by pressing a phosphor bronze plate.

The distance between side surface portion 29 and side surface portion 30 has been previously determined to a dimension equal to the sum of width WC of end portion 23 of circuit element 21 and respective dimensions of gaps S1 and S2. Projection 27a having through-hole 28a provided therein is connected to end 29b of side surface portion 29 while projection 27b having through-hole 28b provided therein is connected to end 30b of side surface portion 30.

Stepped portion 32 recessed toward bottom surface 22b of body 22 is formed by the above-mentioned pressing in an area on bottom surface portion 31 in which end portion 23 of circuit element 21 configured to overlap and be fixed.

End portion 23 of circuit element 21 is aligned in position so as to maintain gap S1 between end portion 23 and side surface portion 29 and gap S2 between end portion 23 and side surface portion 30, then overlaps stepped portion 32 formed on bottom surface 31, and fixed to stepped portion 32 by a resistance welding.

Holders 24 may be formed as separate pieces as shown in FIG. 7. Alternatively, plural holders 24 may be formed in the form of a continuous hoop. This configuration easily aligns end portion 23 of circuit element 21 and realizes a continuous production to improve productivity.

Figure 8:
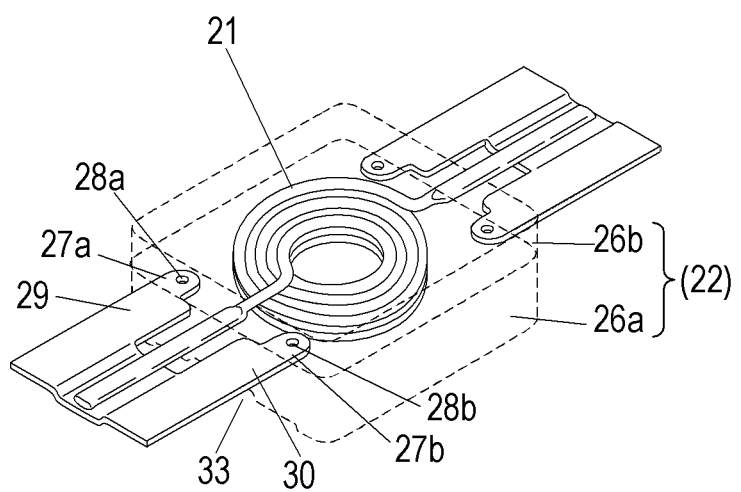
FIG. 8 is a perspective view of the electronic component in accordance with the embodiment for illustrating a process for manufacturing the electronic component.

Next, a binder containing a thermosetting resin is mixed with magnetic metal powder while the thermosetting resin is not completely cured. The mixture is dried and pulverized to obtain magnetic material powder. The magnetic material powder is molded by a compression molding under a pressure of about 1 ton/cm$^2$ to obtain green blocks 26a and 26b shown in FIG. 2. Green blocks 26a and 26b are put together so as to sandwich circuit element 21 and projection 27a and 27b of holder 24, and then re-compression molded under a pressure of about 5 tons/cm². Circuit element 21 is coated with green blocks 26a and 26b to obtain a precursor of body 22 as shown in FIG. 8. During this process, housing recess 33 for accommodating bottom surface portion 31 of holder 24 and stepped portion 32 formed on bottom surface portion 31 is formed in green block 26a by using the mold for the re-compression molding.

Then, this precursor is completely cured by heat treatment at a temperature equal to or higher than about 180° C., thereby providing body 22.

FIG. 8 shows the outline of body 22 by broken lines.

Figure 9:
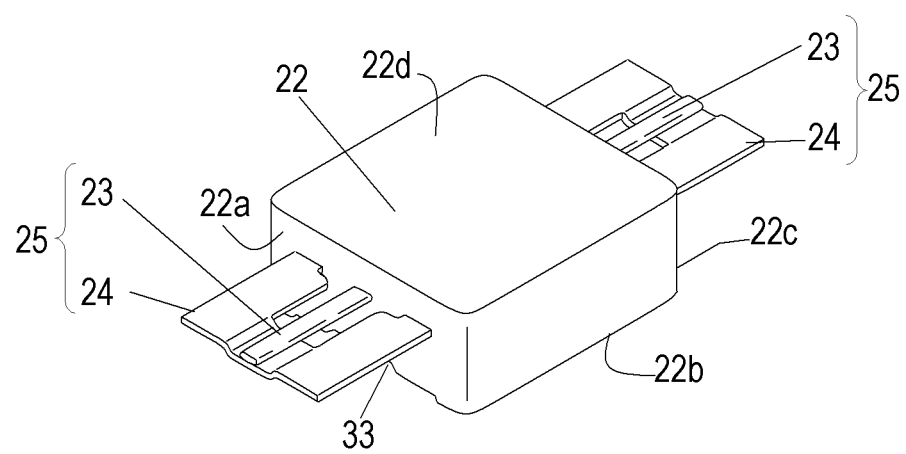
FIG. 9 is a perspective view of the electronic component in accordance with the embodiment for illustrating a process for manufacturing the electronic component.

Next, as shown in FIG. 9, end portion 23 of circuit element 21 and holder 24 are cut at a predetermined position. Holder 24 and end portion 23 of circuit element 21 may then be plated with a solder by, for example, being dipped in molten solder.

Finally, terminal portion 25 including end portion 23 of circuit element 21 and holder 24, or more specifically, including end portion 23 and side surface portions 29 and 30 is bent along side surface 22a (22c) and bottom surface 22b of body 22 from side surface 22a (22c) toward bottom surface 22b.

The above method provides electronic component 1001 shown in FIG. 1A and FIG. 1B.

Figure 10A:
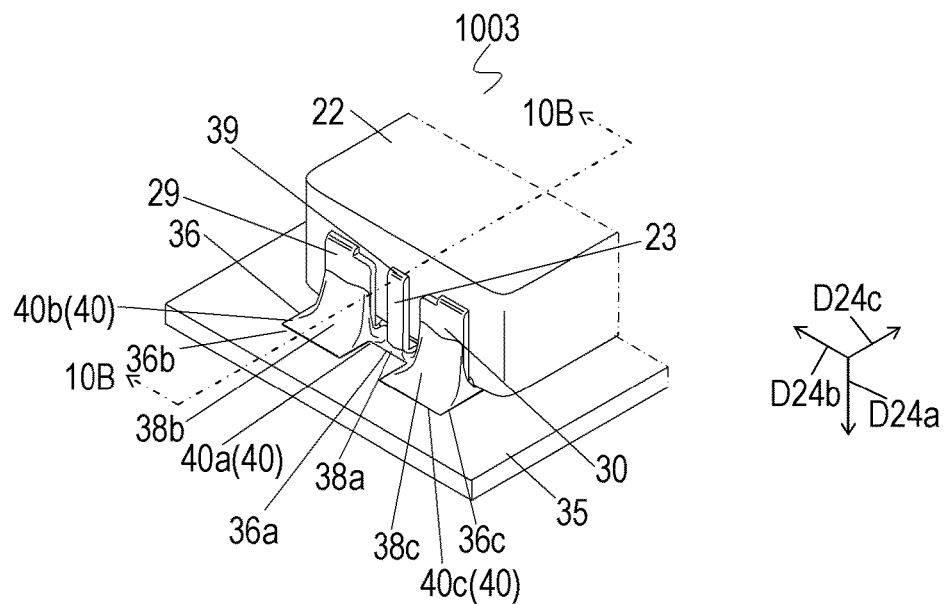
FIG. 10A is a partial perspective view of another electronic device in accordance with the embodiment.
Figure 10B:
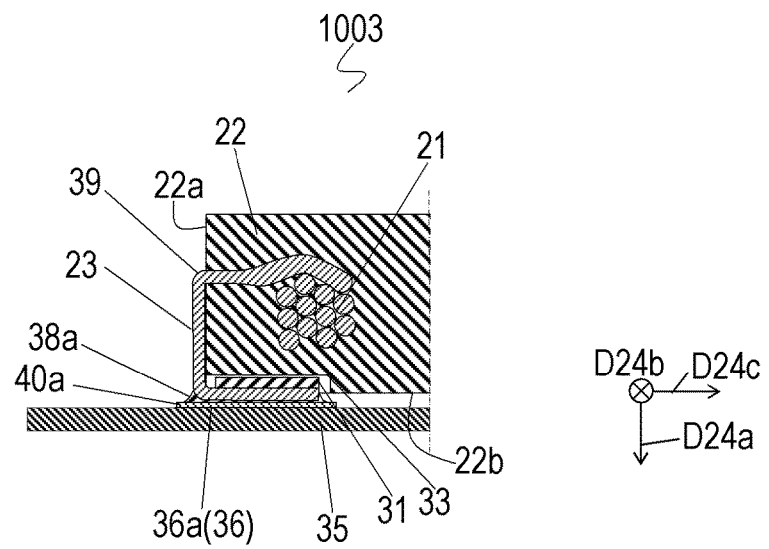
FIG. 10B is a sectional view of the electronic device along 10B-10B shown in FIG. 10A.

FIG. 10A is a partial perspective view of another electronic device 1003 having electronic component 1001 in accordance with the embodiment, and shows electronic component 1001 in a state after the reflow soldering. FIG. 10B is a sectional view of electronic device 1003 along line 10B-10B shown in FIG. 10A. In FIG. 10A and FIG. 10B, components identical to those electronic device 1002 shown in FIG. 3A and FIG. 3B are denoted by the same reference numerals.

In electronic device 1002 shown in FIG. 3A and FIG. 3B, the outline of land 36 on mounting substrate 35 corresponding to side surface portion 29, end portion 23 of circuit element 21, and side surface portion 30 has a straight-line shape. In electronic device 1003 shown in FIG. 10A and FIG. 10B, the outline of land 36 on mounting substrate 35 includes land recess 40a recessed toward body 22 to a position on the land between side surface portion 29 and side surface portion 30. Specifically, land 36 includes part 36a connected to end portion 23 with solder fillet 38a, part 36b connected to side surface portion 29 with solder fillet 38b, and part 36c connected to side surface portion 30 with solder fillet 38c. Outline 40 of land 36 include part 40b which is an outline of part 36b, part 40c which is an outline of part 36c, and land recess 40a which is located between parts 40b and 40c and connected to parts 40b and 40c. Parts 40b and 40c of outline 40 are located on the side opposite to body 22 with respect to side surface portions 29 and 30. Land recess 40a is recessed toward body 22. This configuration reduces the amount of the solder around end portion 23 of circuit element 21, and reduces the height of solder fillet 38a formed around end portion 23 of circuit element 21.

Figure 11A:
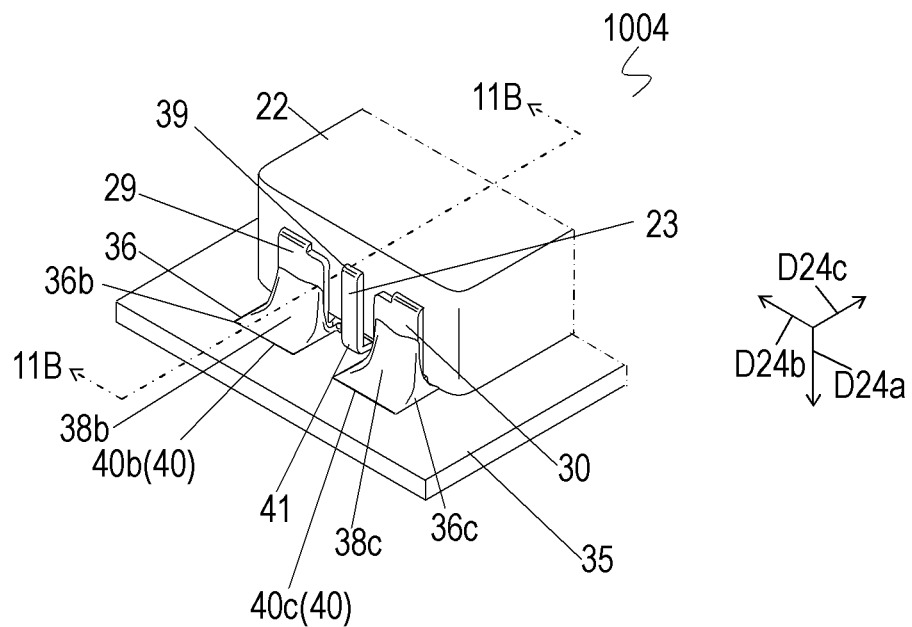
FIG. 11A is a perspective view of the electronic component mounted on a mounting substrate in accordance with the embodiment.
Figure 11B:
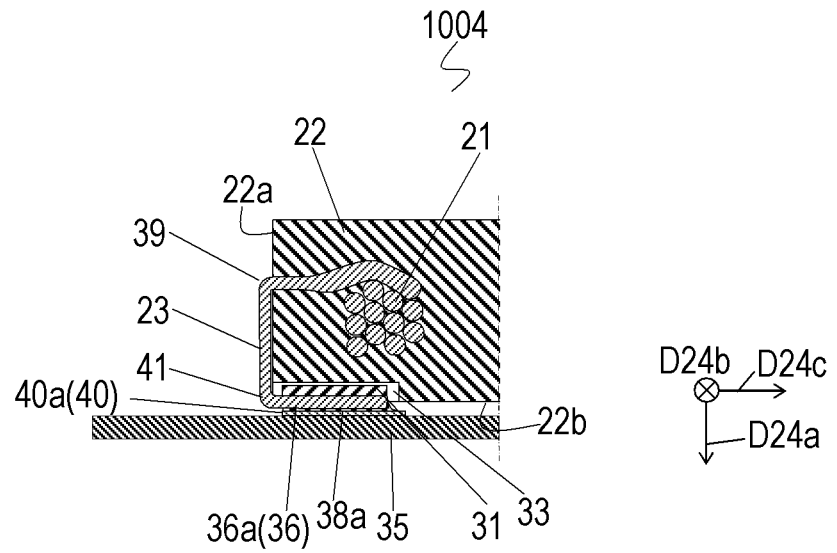
FIG. 11B is a sectional view of the electronic component along line 11B-11B shown in FIG. 11A.

FIG. 11A is a partial perspective view of still another electronic device 1004 in accordance with the embodiment, and shows electronic component 1001 in a state after the reflow soldering. FIG. 11B is a sectional view of electronic device 1004 along line 14B-11B shown in FIG. 11A. In electronic device 1004 shown in FIG. 11A and FIG. 11B, land recess 40a extends more toward electronic component 1001 than electronic device 1003 shown in FIG. 10A and FIG. 10B. That is, land recess 40a extends to an area including bottom surface bent potion 41 of end portion 23 of circuit element 21. Bottom surface bent portion 41 is a portion which is bent from side surface 22a in a direction toward bottom surface 22b of body 22. This configuration prevents the two bent portions, side surface bent portion 39 and bottom surface bent portion 41, of end portion 23 of circuit element 21 from being hardened by solder fillets 38a to 38c, hence reducing a stress of vibration to improve the vibration resistance.

REFERENCE MARKS IN THE DRAWINGS 21 circuit element
22 body
23 end portion
24 holder
25 terminal portion
26a, 26b green block
27a, 27b projection
28a, 28b through-hole
29 side surface portion (first side surface portion)
30 side surface portion (second side surface portion)
31 bottom surface portion
32 stepped portion
33 housing recess
34 accommodating portion
35 mounting substrate
36 land
37 solder
38a-38c solder fillet
39 side surface bent portion
40a land recessed portion
41 bottom surface bent portion

The invention claimed is:

1. An electronic component comprising:
a circuit element;
a body accommodating the circuit element therein; and
a holder made of a metal plate and holding the circuit element, wherein
the body has a side surface and a bottom surface connected to the side surface,
the circuit element has an end portion led out from the side surface of the body, the end portion extending along the side surface toward the bottom surface of the body,
the holder has:
    a first side surface portion and a second side surface portion which face the side surface of the body such that the end portion of the circuit element is positioned between the first side surface portion and second side surface portion and is located away from the first side surface portion and second side surface portion; and
    a bottom surface portion connected to the first side surface portion and the second side surface portion, the bottom surface portion facing the bottom surface of the body, the end portion of the circuit element being fixed to the bottom surface portion,
the first side surface portion has a first open edge which faces the end portion of the circuit element across a first gap,
the second side surface portion has a second open edge which faces the end portion of the circuit element across a second gap, and
each of a dimension of the first gap and a dimension of the second gap is twice to 10 times a width of the end portion of the circuit element.

2. An electronic component comprising:
a circuit element;
a body accommodating the circuit element therein; and
a holder made of a metal plate and holding the circuit element, wherein
the body has a side surface and a bottom surface connected to the side surface,
the circuit element has an end portion led out from the side surface of the body, the end portion extending along the side surface toward the bottom surface of the body,
the holder has:
   a first side surface portion and a second side surface portion which face the side surface of the body such that the end portion of the circuit element is positioned between the first side surface portion and second side surface portion and is located away from the first side surface portion and second side surface portion; and
   a bottom surface portion connected to the first side surface portion and the second side surface portion, the bottom surface portion facing the bottom surface of the body, the end portion of the circuit element being fixed to the bottom surface portion,
the first side surface portion has a first open edge which faces the end portion of the circuit element across a first gap,
the second side surface portion has a second open edge which faces the end portion of the circuit element across a second gap, and
each of a dimension of the first gap and a dimension of the second gap is twice to 10 times a thickness of the holder.

3. An electronic component comprising:
a circuit element;
a body accommodating the circuit element therein; and
a holder made of a metal plate and holding the circuit element, wherein
the body has a side surface and a bottom surface connected to the side surface,
the circuit element has an end portion led out from the side surface of the body, the end portion extending along the side surface toward the bottom surface of the body,
the holder has:
   a first side surface portion and a second side surface portion which face the side surface of the body such that the end portion of the circuit element is positioned between the first side surface portion and second side surface portion and is located away from the first side surface portion and second side surface portion; and
   a bottom surface portion connected to the first side surface portion and the second side surface portion, the bottom surface portion facing the bottom surface of the body, the end portion of the circuit element being fixed to the bottom surface portion,
the first side surface portion has a first open edge which faces the end portion of the circuit element across a first gap,
the second side surface portion has a second open edge which faces the end portion of the circuit element across a second gap, and
the end portion of the circuit element lead out from the side surface of the body at a position between a center of a height of the body and the bottom surface of the body.

4. An electronic component comprising:
a circuit element;
a body accommodating the circuit element therein; and
a holder made of a metal plate and holding the circuit element, wherein
the body has a side surface and a bottom surface connected to the side surface,
the circuit element has an end portion led out from the side surface of the body, the end portion extending along the side surface toward the bottom surface of the body,
the holder has:
   a first side surface portion and a second side surface portion which face the side surface of the body such that the end portion of the circuit element is positioned between the first side surface portion and second side surface portion and is located away from the first side surface portion and second side surface portion; and
   a bottom surface portion connected to the first side surface portion and the second side surface portion, the bottom surface portion facing the bottom surface of the body, the end portion of the circuit element being fixed to the bottom surface portion,
the first side surface portion has a first open edge which faces the end portion of the circuit element across a first gap,
the second side surface portion has a second open edge which faces the end portion of the circuit element across a second gap, and
widths of the first side surface portion and the second side surface portion are larger than a width of the end portion of the circuit element.

5. The electronic component according to claim 4, wherein each of a dimension of the first gap and a dimension of the second gap is larger than a thickness of the end portion of the circuit element.

6. The electronic component according to claim 4, wherein the first side surface portion has one end connected to the bottom surface portion and another end opposite to the one end of the first side surface portion, the first open edge of the first side surface portion extends and opens from the one end of the first side surface portion to the another end of the first side surface portion, the second side surface portion has one end connected to the bottom surface portion and another end opposite to the one end of the second open side surface portion, and the second open edge of the second side surface portion extends and opens from the one end of the second side surface portion to the another end of the second side surface portion.

7. An electronic device comprising:
an electronic component; and
a mounting substrate having a surface having the electronic component mounted thereon, wherein
the electronic component includes:
   a circuit element;
   a body accommodating the circuit element therein; and
   a holder made of a metal plate and holding the circuit element,
the body has a side surface and a bottom surface connected to the side surface,
the circuit element has an end portion led out from the side surface of the body, the end portion extending along the side surface toward the bottom surface of the body, the holder has:
- a first side surface portion and a second side surface portion which face the side surface of the body such that the end portion of the circuit element is positioned between the first side surface portion and second side surface portion and is located away from the first side surface portion and second side surface portion; and
- a bottom surface portion connected to the first side surface portion and the second side surface portion, the bottom surface portion facing the bottom surface of the body, the end portion of the circuit element being fixed to the bottom surface portion, the mounting substrate includes:
- an insulating substrate; and
- a land disposed on the insulating substrate and connected to the first side surface portion and the second side surface portion of the electronic component, and the land has an outline including a land recess extending toward a position on the land between the first side surface portion and the second side surface portion.

8. The electronic device according to claim 7, wherein the first side surface portion has a first open edge which faces the end portion of the circuit element across a first gap, and
the second side surface portion has a second open edge which faces the end portion of the circuit element across a second gap.

9. The electronic device according to claim 7, wherein widths of the first side surface portion and the second side surface portion are larger than a width of the end portion of the circuit element.

10. The electronic device according to claim 7, wherein each of a dimension of a gap between the first side surface portion and the end portion of the circuit element and a dimension of a gap between the second side surface portion and the end portion of the circuit element is larger than a thickness of the end portion of the circuit element.

11. The electronic device according to claim 7, wherein each of a dimension of a gap between the first side surface portion and the end portion of the circuit element and a dimension of a gap between the second side surface portion and the end portion of the circuit element is twice to 10 times a width of the end portion of the circuit element.

12. The electronic device according to claim 7, wherein each of a dimension of a gap between the first side surface portion and the end portion of the circuit element and a dimension of a gap between the second side surface portion and the end portion of the circuit element is twice to 10 times a thickness of the holder.

13. The electronic device according to claim 7, wherein the end portion of the circuit element lead out from the side surface of the body at a position between a center of a height of the body and the bottom surface of the body.

14. The electronic component according to claim 1, wherein each of a dimension of the first gap and a dimension of the second gap is twice to 10 times a thickness of the holder.

15. The electronic component according to claim 1, wherein the end portion of the circuit element lead out from the side surface of the body at a position between a center of a height of the body and the bottom surface of the body.

16. The electronic component according to claim 1, wherein widths of the first side surface portion and the second side surface portion are larger than a width of the end portion of the circuit element.

17. The electronic component according to claim 1, wherein each of a dimension of the first gap and a dimension of the second gap is larger than a thickness of the end portion of the circuit element.

18. The electronic component according to claim 1, wherein
the first side surface portion has one end connected to the bottom surface portion and another end opposite to the one end of the first side surface portion,
the first open edge of the first side surface portion extends and opens from the one end of the first side surface portion to the another end of the first side surface portion,
the second side surface portion has one end connected to the bottom surface portion and another end opposite to the one end of the second open side surface portion, and
the second open edge of the second side surface portion extends and opens from the one end of the second side surface portion to the another end of the second side surface portion.

19. The electronic component according to claim 2, wherein the end portion of the circuit element lead out from the side surface of the body at a position between a center of a height of the body and the bottom surface of the body.

20. The electronic component according to claim 2, wherein widths of the first side surface portion and the second side surface portion are larger than a width of the end portion of the circuit element.

21. The electronic component according to claim 2, wherein each of a dimension of the first gap and a dimension of the second gap is larger than a thickness of the end portion of the circuit element.

22. The electronic component according to claim 2, wherein
the first side surface portion has one end connected to the bottom surface portion and another end opposite to the one end of the first side surface portion,
the first open edge of the first side surface portion extends and opens from the one end of the first side surface portion to the another end of the first side surface portion,
the second side surface portion has one end connected to the bottom surface portion and another end opposite to the one end of the second open side surface portion, and
the second open edge of the second side surface portion extends and opens from the one end of the second side surface portion to the another end of the second side surface portion.

23. The electronic component according to claim 3, wherein widths of the first side surface portion and the second side surface portion are larger than a width of the end portion of the circuit element.

24. The electronic component according to claim 3, wherein each of a dimension of the first gap and a dimension of the second gap is larger than a thickness of the end portion of the circuit element.

25. The electronic component according to claim 3, wherein
the first side surface portion has one end connected to the bottom surface portion and another end opposite to the one end of the first side surface portion,
the first open edge of the first side surface portion extends and opens from the one end of the first side surface portion to the another end of the first side surface portion, the second side surface portion has one end connected to the bottom surface portion and another end opposite to the one end of the second open side surface portion, and the second open edge of the second side surface portion extends and opens from the one end of the second side surface portion to the another end of the second side surface portion.

26. The electronic component according to claim 7, wherein the first side surface portion has one end connected to the bottom surface portion and another end opposite to the one end of the first side surface portion, the first open edge of the first side surface portion extends and opens from the one end of the first side surface portion to the another end of the first side surface portion, the second side surface portion has one end connected to the bottom surface portion and another end opposite to the one end of the second open side surface portion, and the second open edge of the second side surface portion extends and opens from the one end of the second side surface portion to the another end of the second side surface portion.

* * * * *